United States Patent
Jang

(10) Patent No.: US 8,349,719 B2
(45) Date of Patent: Jan. 8, 2013

(54) SEMICONDUCTOR DEVICE AND METHOD FOR FABRICATING THE SAME

(75) Inventor: Tae Su Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 175 days.

(21) Appl. No.: 12/772,282

(22) Filed: May 3, 2010

(65) Prior Publication Data

US 2010/0327357 A1  Dec. 30, 2010

(30) Foreign Application Priority Data

Jun. 24, 2009  (KR) ................ 10-2009-0056664

(51) Int. Cl.
*H01L 21/3205* (2006.01)
*H01L 21/4763* (2006.01)

(52) U.S. Cl. ............... 438/587; 257/350; 257/E21.582; 257/E29.286; 438/164

(58) Field of Classification Search .............. 438/587, 438/164; 257/E21.483, E21.582, E29.286, 257/E27.121
See application file for complete search history.

(56) References Cited

U.S. PATENT DOCUMENTS

| 5,021,359 A  * | 6/1991 | Young et al. | 438/154 |
| 2009/0020879 A1* | 1/2009 | Lee et al. | 257/773 |
| 2009/0230472 A1* | 9/2009 | Chung | 257/347 |

FOREIGN PATENT DOCUMENTS

| KR | 100363099 | 12/2002 |
| KR | 101015435 | 2/2011 |

* cited by examiner

*Primary Examiner* — Caridad Everhart
(74) *Attorney, Agent, or Firm* — IP & T Group LLP

(57) ABSTRACT

A semiconductor device and a method for fabricating the same. A plurality of gate patterns are formed over a first-conductivity type silicon layer of a silicon-on-insulator semiconductor substrate including a buried insulation layer, so as to be separated from each other. A plurality of silicon bodies are formed under the gate patterns, by removing a portion of the first-conductivity type silicon layer exposed between the gate patterns. A plurality of polysilicon spacers are formed over a sidewall of the silicon bodies, and each contains a second-conductivity type dopant. A contact plug is electrically connected to at least one of the polysilicon spacers.

18 Claims, 3 Drawing Sheets

SEMICONDUCTOR DEVICE AND METHOD FOR FABRICATING THE SAME

CROSS REFERENCE TO RELATED APPLICATION

The present application claims priority to Korean Patent Application Number 10-2009-0056664 filed on Jun. 24, 2009, the entire contents of which application is incorporated herein for all purposes by this reference.

BACKGROUND OF THE INVENTION

1. Field of the Invention

The present invention relates to a semiconductor device and a method for fabricating the same, and more particularly, to a floating body cell and a method for fabricating the same.

2. Description of the Related Art

A finer fabrication process of a semiconductor device confronts many technical problems, such as in the fabrication of a Dynamic Random Access Memory (DRAM), in which a unit memory cell is implemented with one transistor and one capacitor. Among these problems, it is most difficult to maintain a sufficient data retention time while improving short channel effect, and to fabricate a capacitor having sufficient capacitance while minimizing dielectric leakage in a small area. In particular, a fabrication process of a capacitor, which can ensure reliability while satisfying capacitance necessary for the operation of a DRAM, is faced with technical problems that are difficult to overcome. In an attempt to solve these problems, many experiments have been carried out on a 1T DRAM using the floating body effect of a transistor.

While a typical 1T-1C DRAM cell stores an electric charge in a capacitor, a floating body cell of the 1T DRAM is used as a memory device based on a change in threshold voltage (VT) of a transistor when an electric charge is stored. In general, a transistor forming the floating body cell is fabricated using a silicon wafer having a silicon-on-insulator (SOI) structure.

When floating body cells are fabricated using a SOI silicon wafer, adjacent cells are required to be electrically isolated from each other in order to realize two or more cells in one active region. Conventional methods involve isolating memory cells from each other using junctions by implementing high-concentration ions into sources and drains, or reducing the thickness of a silicon layer to be used as floating bodies. However, the cell isolation method using merely the junctions may degrade punch characteristics of a buried insulation layer (e.g., a buried oxide (BOX) layer) of the SOI substrate, which underlies the floating bodies. Meanwhile, the method of reducing the thickness of the floating bodies may disadvantageously reduce hole storage capability. Furthermore, the conventional cell isolation method may have a problem of data interference between adjacent cells caused by, for example, a PNP (or NPN) bipolar parasitic transistor including a p-type (or n-type) floating body, an n-type (or p-type) source/drain, and a p-type (or n-type) floating body.

The information disclosed in this Background of the Invention section is only for enhancing an understanding of the background of the invention and should not be taken as an acknowledgment or any form of suggestion that this information forms the prior art that is already known to a person skilled in the art.

BRIEF SUMMARY OF THE INVENTION

Various aspects of the present invention provide a semiconductor device and a method for fabricating the same, which can eliminate interference between memory cells caused by a bipolar parasitic transistor when the memory cells of floating body cells are formed over the same active region of an SOI silicon wafer.

Further, the present invention provides a semiconductor device, which can retain sufficient hole storage capability of a floating body while improving punch characteristics of a memory cell, and a method for fabricating the same.

In a first aspect of the invention, the semiconductor device may include a plurality of gate patterns formed over a first-conductivity type silicon layer of a silicon-on-insulator semiconductor substrate including a buried insulation layer, so as to be separated from each other; a plurality of silicon bodies, each formed under a corresponding one of the gate patterns, by removing a portion of the first-conductivity type silicon layer exposed between the gate patterns; a plurality of polysilicon spacers, each formed over a sidewall of the silicon bodies and each containing a second-conductivity type dopant; and a contact plug electrically connected to at least one of the polysilicon spacers.

Each of the gate patterns may include a gate insulating film formed over the corresponding silicon body; a gate electrode formed over the gate insulating film; and insulation spacers formed over opposite sidewalls of the gate electrode. The silicon bodies may be formed over the buried insulation layer, so as to be spaced from each other.

In the first aspect of the invention, the polysilicon spacers may extend from the buried insulation layer to a sidewall of the gate patterns. Also, one of the polysilicon spacers may be formed on each sidewall of the silicon bodies. Moreover, a pair of the polysilicon spacers, each of which is formed over one sidewall of a corresponding one of the silicon bodies, may be separated from each other.

The contact plug may be located between a pair of the polysilicon spacers opposing each other. Each of the polysilicon spacers is formed over one sidewall of a corresponding one of the silicon bodies, which are adjacent to each other. The contact plug may be made of a metal material. The contact plug may be formed to be adjacent to or to adjoin the buried insulation layer.

In the first aspect of the invention, the semiconductor device may further include a plurality of source/drain diffusion regions formed in part of opposite sidewalls of the silicon bodies adjacent to or adjoining the polysilicon spacers, in which the source/drain diffusion regions contain the second-conductivity type dopant diffused from the polysilicon spacers. Thus, part of the silicon body between the source/drain diffusion regions may act as a floating body in a floating state when the semiconductor device is operating.

In a second aspect of the invention, the semiconductor device may include a first-conductivity type silicon body formed over a buried insulation layer of a silicon-on-insulator semiconductor substrate; a gate pattern formed over the silicon body; at least one polysilicon spacer formed over one or more sidewalls of the silicon body and containing a second-conductivity type dopant; and a contact plug electrically connected with the at least one polysilicon spacer.

In the second aspect of the invention, the at least one polysilicon spacer may extend from the buried insulation layer to one sidewall of the gate pattern. A pair of the polysilicon spacers may be formed over opposite sidewalls of the silicon body. The semiconductor device may further include two source/drain diffusion regions formed in part of opposite sidewalls of the silicon body adjacent to or adjoining the pair of the polysilicon spacers, in which the source/drain diffusion regions contain the second-conductivity type dopant diffused from the polysilicon spacer. Thus, part of the silicon body between the source/drain diffusion regions may act as a floating body in a floating state when the semiconductor device is operating. The contact plug may be made of metal, and be formed to be adjacent to or to adjoin the buried insulation layer.

In a third aspect of the invention, the method for fabricating a semiconductor device may include steps of: forming a plurality of gate patterns over a first-conductivity type silicon layer of a silicon-on-insulator semiconductor substrate including a buried insulation layer, so that the gate patterns are separated from each other; forming a plurality of silicon bodies, each under a corresponding one of the gate patterns, by removing a portion of the first-conductivity type silicon layer exposed between the gate patterns; forming a plurality of polysilicon spacers each over a sidewall of the silicon bodies, the polysilicon spacers containing a second-conductivity type dopant; and forming a contact plug electrically connected to at least one of the polysilicon spacers.

The step of forming the plurality of silicon bodies may include isolating the silicon bodies from each other by removing the portion of the first-conductivity type silicon layer until a surface of the buried insulation layer is exposed. The step of forming the plurality of polysilicon spacers may include forming a polysilicon layer containing the second-conductivity type dopant over the semiconductor substrate; and removing a portion of the polysilicon layer, so that each of the polysilicon spacers is formed selectively over a sidewall of the gate patterns and a sidewall of the silicon bodies. As an alternative, the step of forming a polysilicon spacer may include forming a polysilicon layer over the semiconductor substrate; implanting second-conductivity type dopant ions into the polysilicon layer; and removing a portion of the polysilicon layer, so that each of the polysilicon spacers is formed selectively over a sidewall of the gate patterns and a sidewall of the silicon bodies.

The step of forming a contact plug may include filling a conductive material in a space between a pair of the polysilicon spacers, wherein one of the polysilicon spacers is formed over one of the silicon bodies and the other polysilicon spacer is formed over an adjacent silicon body, so that the polysilicon spacers oppose each other. In addition, the method may further include diffusing the second-conductivity type dopant from the polysilicon spacers, so that source/drain diffusion regions are formed in part of opposite sidewalls of the silicon bodies adjacent to or adjoining the polysilicon spacers.

According to embodiments of the invention, the floating body cells having the cell isolation structure can eliminate a parasitic effect, which would occur between adjacent cells. In addition, sufficient hole storage capability can be ensured since the floating bodies can maintain a sufficient thickness. Furthermore, the punch characteristics of the memory cell can also be improved since high concentration ion implantation for isolating the adjacent cells is not required.

The methods and apparatuses of the present invention have other features and advantages which will be apparent from, or are set forth in more detail in, the accompanying drawings, which are incorporated herein, and the following Detailed Description of the Invention, which together serve to explain certain principles of the present invention.

BRIEF DESCRIPTION OF THE DRAWINGS

FIGS. 1 through 6 are cross-sectional views illustrating process steps of a method for fabricating a semiconductor device according to an exemplary embodiment of the invention, in which:

FIG. 1 is a cross-sectional view illustrating a process step in which gate patterns are formed over an SOI substrate;

FIG. 2 is a cross-sectional view illustrating a process step in which silicon bodies are formed by removing portions of the silicon substrate exposed between the adjacent gate patterns;

FIG. 3 is a cross-sectional view illustrating a process step in which a polysilicon layer is formed over sidewalls of the gate patterns and over sidewalls of the silicon bodies;

FIG. 4 is a cross-sectional view illustrating a process step in which polysilicon spacers are formed by etching-back the polysilicon layer;

FIG. 5 is a cross-sectional view illustrating a process step in which a conductive material is filled in between the adjacent gate patterns and between the adjacent silicon bodies; and FIG. 6 is a cross-sectional view illustrating a process step in which contact plugs are formed between adjacent memory cells.

DETAILED DESCRIPTION OF THE INVENTION

Reference will now be made in detail to various exemplary embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents, and other embodiments, which may be included within the spirit and scope of the invention, as defined by the appended claims.

Referring to FIGS. 1 through 6, the structure of a semiconductor device and a method for fabricating the same in accordance with an exemplary embodiment of the invention will be described according to process steps. For reference, FIGS. 1 through 6 illustrate an exemplary embodiment in which a plurality of floating body cells are formed in one active area.

Figure 1:
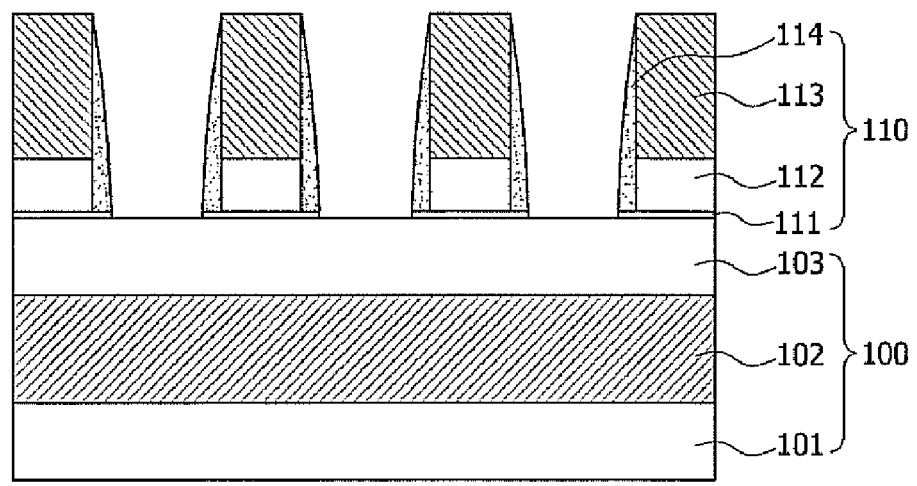

First, referring to FIG. 1, a plurality of gate patterns 110 separated from each other are formed over a silicon substrate 100 having a silicon-on-insulator (SOI) structure, in which a lower silicon layer 101, a buried oxide (BOX) layer 102, and an upper silicon layer 103 are sequentially layered one over another. The upper silicon layer 103 has active regions, over which memory cells will be formed in an oxide layer process. The upper silicon layer 103 is formed as a first-conductivity type silicon layer due to ion implantation of a first-conductivity type dopant (e.g., a p-type dopant).

Each of the gate patterns 110 includes a gate insulating film 111, a gate electrode 112 made of polysilicon, and a hard mask layer 113 (e.g., made of silicon nitride), which are layered one over another. The hard mask layer 113 serves to protect the gate electrode 112 in the following etching process. Although not shown in the figure, a tungsten layer can be additionally formed over the polysilicon layer of the gate electrode 112. The tungsten layer is for improving electric conductivity at the time of forming a contact plug for the gate electrode 112 in the following process. The tungsten layer is not essential, but can be optionally formed. Furthermore, insulation spacers 114 are formed over both sidewalls of the gate electrode 112 to protect the gate electrode 112. The insulating spacers 114 are made of, for example, a silicon oxide layer or a silicon nitride layer.

Figure 2:
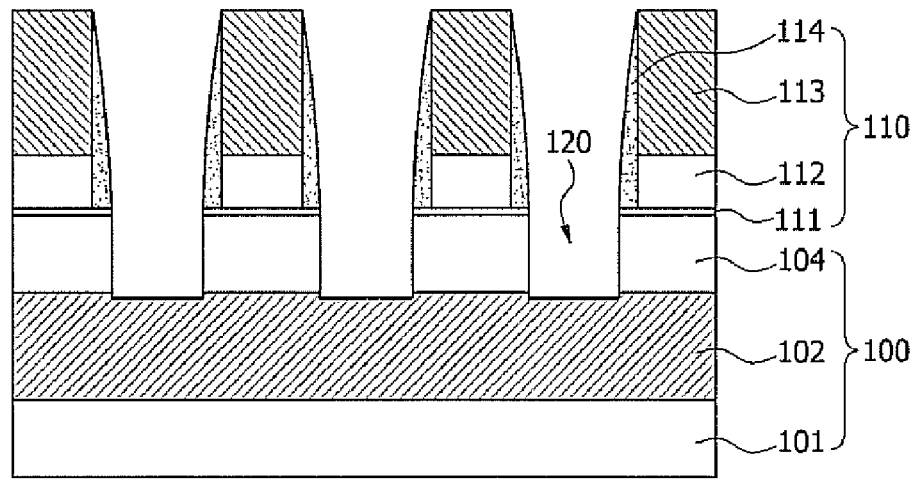

Then, as shown in FIG. 2, recesses 120 are formed by removing portions of the upper silicon layer 103, exposed between the adjacent gate patterns 110. The recess 120 can be formed by, for example, an etching process using the hard mask layers 113 and the insulation spacers 114 as an etching mask. The exposed portions of the upper silicon layer 103 are etched until the surface of the BOX layer 102 having the SOI structure is exposed, so that a plurality of silicon bodies 104 isolated from each other are formed under the gate patterns 110. The silicon bodies 104 are portions of the upper silicon layer 103, which are not removed in the etching process that forms the recesses 120, that act as floating bodies of the floating body cells described below. In addition, the adjacent silicon bodies 104 are isolated from each other by the recesses 120 because they are required to maintain a floating state while a memory device is operating. For complete isolation between the silicon bodies 104, etching conditions (e.g., etching time) of the silicon layer 103 are adjusted for the sake of uniformity in the process of forming the recesses 120, so that predetermined portions of the BOX layer 102 are etched to a depth of 1 nm to 10 nm.

Figure 3:
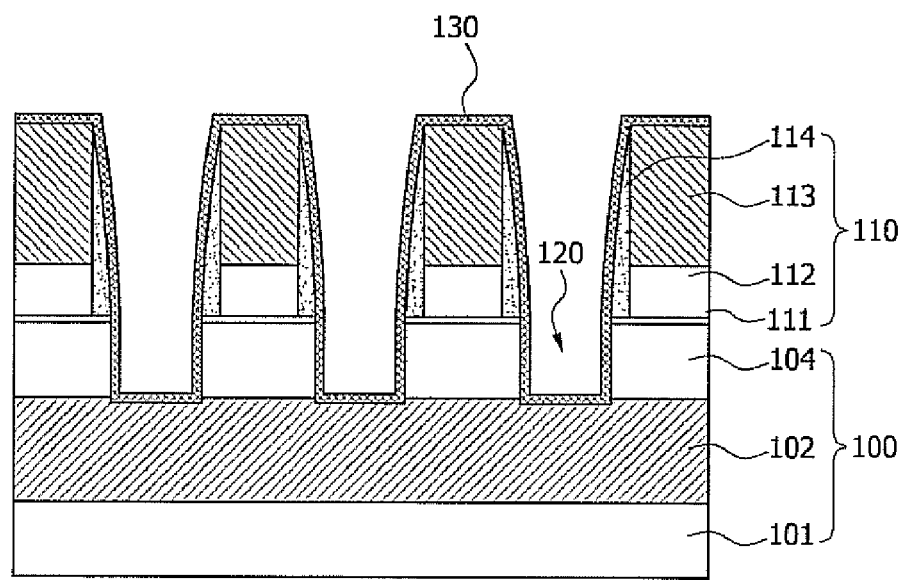

Referring to FIG. 3, a polysilicon layer 130 having a predetermined thickness is formed over the above-described structure of the semiconductor substrate 100. The thickness of the polysilicon layer 130 is determined so that the recesses 120 are not filled up. For example, the deposition thickness of the polysilicon layer 130 can be smaller than half the width of the recesses 120. In this embodiment, the polysilicon layer 130 is deposited at a thickness of about 100 nm.

When the silicon bodies 104 are doped with the first-conductivity type dopant (e.g., p-type dopant), the polysilicon layer 130 can contain a second-conductivity type dopant (e.g., an n-type dopant) having an opposite conductivity to that of the first-conductivity type dopant. The polysilicon layer 130 containing the second-conductivity type dopant can be formed by depositing an undoped polysilicon layer and then implanting second-conductivity type dopant ions into the undoped polysilicon layer. Alternatively, the polysilicon layer 130 can be formed as a doped polysilicon layer into which the second-conductivity type dopant is added in a deposition process. The second-conductivity type dopant of the polysilicon layer 130 can have a concentration from $1E19/cm^3$ to $1E22/cm^3$.

Figure 4:
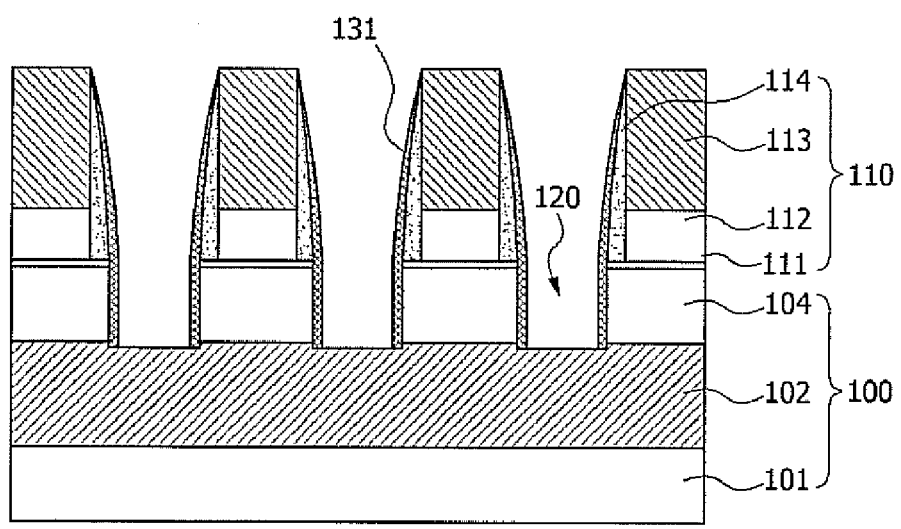

After the polysilicon layer 130 containing the second-conductivity type dopant is formed as described above, an etch-back process is carried out over the entire surface of the semiconductor substrate 100, thereby forming polysilicon spacers 131 extending from the sidewalls of the gate patterns 110 to the sidewalls of the silicon bodies 104, as shown in FIG. 4. In the etch-back process, it is required that the polysilicon layer 130 does not remain over the top surface of the gate patterns 110 or the bottom surface of the recesses 120 (i.e., the surface of the BOX layer 102). In addition, the polysilicon spacers 131 can preferably be formed with a uniform thickness (e.g., from 0.1 nm to 50 nm in a direction perpendicular to the sidewalls of the silicon bodies 104) over one or more sidewalls of the silicon bodies 104.

Figure 5:
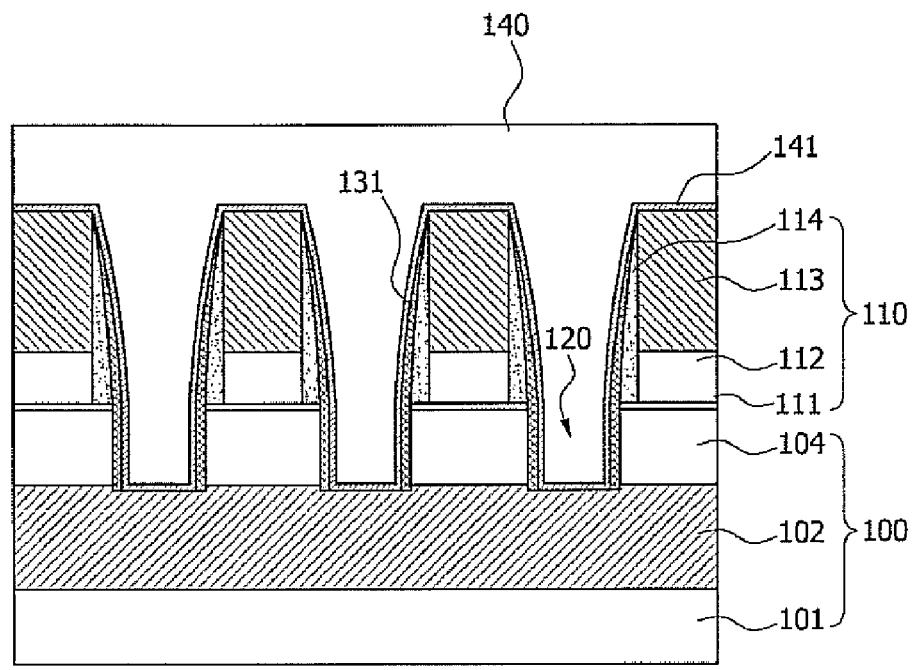
Figure 6:
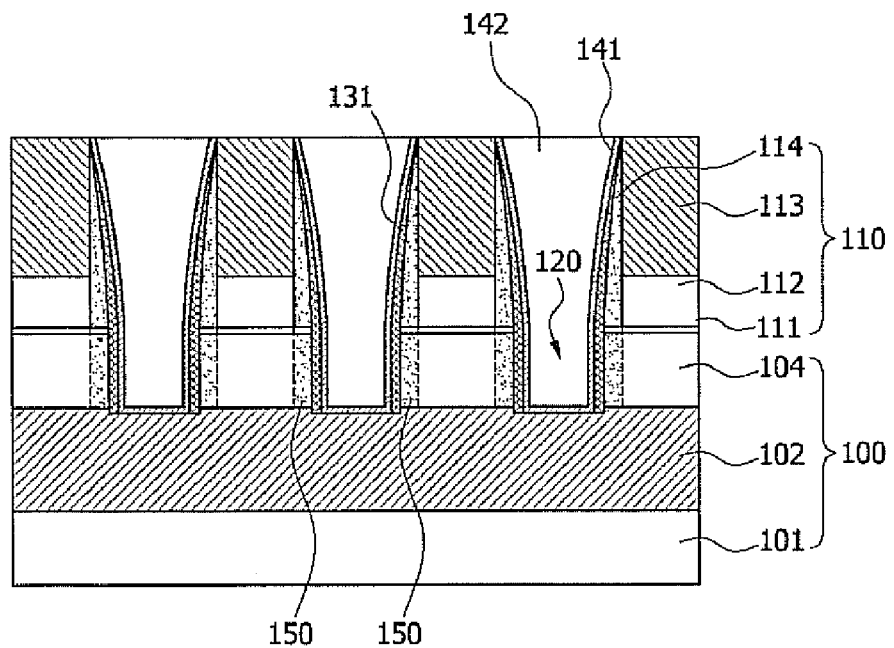

Afterwards, as shown in FIG. 5, a conductive material 140 is applied to fill up the recesses 120 between the adjacent silicon bodies 104 and between the adjacent gate patterns 110. The conductive material may be implemented with a metal, such as tungsten (W), which has excellent electric conductivity. A barrier metal layer 141 made of, for example, TiN and WNx can also be formed to reduce contact resistance between the polysilicon spacers 131 and the conductive material 140 (i.e., the metal). A portion of the conductive material 140 overlying the gate patterns 110 is then removed by a planarization process, thereby forming contact plugs 142 filling the recesses 120, as shown in FIG. 6.

Because the contact plugs 142 fill in the recesses 120, they can be adjacent to or adjoin the BOX layer 102, which is exposed when the recesses 120 are formed. The contact plugs 142 made of metal, which are adjacent to or adjoin the BOX layer 102, can prevent leakage current between adjacent silicon bodies 104. While the contact plugs 142 made of metal might otherwise increase leakage current when they come into contact with the silicon bodies 104, the polysilicon spacers 131 of this embodiment can prevent direct contact between the silicon bodies 104 and the metal contact plugs 142. As a result, this embodiment having the polysilicon spacers 131 can prevent leakage current from increasing.

The second-conductivity type dopant in the polysilicon spacers 131 can diffuse into the silicon bodies 104, thereby forming source/drain diffusion regions 150. Heat treatment for forming the source/drain diffusion regions 150 can be performed during the process of forming the polysilicon spacers, or in conjunction with heat treatment performed during the following fabrication process of a semiconductor device. The source/drain diffusion regions 150, formed as explained above, are located at opposite sides of the silicon bodies 104, and are spaced from each other at predetermined intervals. The inner regions of the silicon bodies 104 between the source/drain diffusion regions 150 act as floating bodies when a plurality of the floating body cells are operating.

In the semiconductor device fabricated according to the above-described method, a unit memory cell is implemented with a floating body cell. Each of the floating body cells formed in one active region includes the first-conductivity type silicon body 104, the gate electrode 112 formed over the silicon body 104 with the gate insulating film 111 interposed between the silicon body 104 and the gate electrode 112, the polysilicon spacer 131 formed over one or more sidewalls of the silicon body 104 and containing a second-conductivity type dopant, and the contact plug 142 electrically connected with the polysilicon spacer 131. The floating body cell also includes the source/drain diffusion regions 150 formed by the diffusion of the second-conductivity type dopant from the polysilicon spacer 131 into the underlying silicon body 104.

In the semiconductor device in accordance with this embodiment of the invention, the isolation structure between a plurality of unit memory cells formed in one active region is configured such that one polysilicon spacer 131 formed over the sidewall of one silicon body 104, acting as a floating body, is spaced from an adjacent polysilicon spacer 131 formed over the sidewall of an adjacent silicon body 104, and a single contact plug 142 connected to both polysilicon spacers 131 fills the space (i.e., the recess 120) between the polysilicon spacers 131. Accordingly, the contact plugs 142 serve to isolate the adjacent memory cells from each other unlike the conventional isolating structure, which uses junctions. As a result, the polysilicon spacer 131 interposed between the metal contact plug 142 and the silicon body 104 can solve the problem of increasing leakage current caused by the metal-silicon contact. Furthermore, the metal contact plugs 142 can significantly reduce the electric resistance of signal lines.

In addition, in the semiconductor device in accordance with this embodiment of the invention, the silicon bodies 104 of the floating body cells are isolated from each other, and a structure including, for example, a metal contact plug 142 between two n-type polysilicon spacers 131 is provided between adjacent p-type silicon bodies 104. Accordingly, the cell isolation structure in accordance with an exemplary embodiment of the invention can eliminate a parasitic effect, which would otherwise occur in a conventional cell isolation structure due to a bipolar transistor having a PNP structure, such as, an n-type source/drain between two p-type bodies.

In particular, in the floating body cell of the above-described structure, the adjacent cells can be isolated from each other with the floating bodies (i.e., the silicon bodies 104) maintaining a sufficient thickness so that sufficient hole storage capability can be ensured. Furthermore, the punch characteristics of the memory cell can also be improved since high concentration ion implantation for isolating the adjacent cells is not required.

The foregoing descriptions of specific exemplary embodiments of the present invention have been presented for purposes of illustration to and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the claims appended hereto and their equivalents.

What is claimed is:

1. A semiconductor device comprising:
   a plurality of gate patterns formed over a first-conductivity type silicon layer of a silicon-on-insulator semiconductor substrate including a buried insulation layer, so as to be separated from each other;
   a plurality of silicon bodies, each formed under a corresponding one of the gate patterns, by removing a portion of the first-conductivity type silicon layer exposed between the gate patterns;
   a plurality of polysilicon spacers, each formed over a sidewall of the silicon bodies and each containing a second-conductivity type dopant; and
   a contact plug electrically connected to at least one of the polysilicon spacers,
   wherein the polysilicon spacers extend from the buried insulation layer to a sidewall of the gate patterns.

2. The semiconductor device in accordance with claim 1, wherein each of the gate patterns comprises:
   a gate insulating film formed over the corresponding silicon body;
   a gate electrode formed over the gate insulating film; and
   insulation spacers formed over opposite sidewalls of the gate electrode.

3. The semiconductor device in accordance with claim 1, wherein the silicon bodies are formed over the buried insulation layer, so as to be spaced from each other.

4. The semiconductor device in accordance with claim 1, wherein one of the polysilicon spacers is formed on each sidewall of the silicon bodies.

5. The semiconductor device in accordance with claim 1, wherein the contact plug is located between a pair of the polysilicon spacers opposing each other, wherein each of the polysilicon spacers is formed over one sidewall of a corresponding one of the silicon bodies, which are adjacent to each other.

6. The semiconductor device in accordance with claim 1, wherein the contact plug is made of metal.

7. The semiconductor device in accordance with claim 1, wherein the contact plug is adjacent to or adjoins the buried insulation layer.

8. The semiconductor device in accordance with claim 1, further comprising a plurality of source/drain diffusion regions formed in part of opposite sidewalls of the silicon bodies adjacent to or adjoining the polysilicon spacers, wherein each source/drain diffusion region contains the second-conductivity type dopant diffused from the polysilicon spacers,
   wherein part of the silicon body between the source/drain diffusion regions acts as a floating body in a floating state when the semiconductor device is operating.

9. A semiconductor device comprising:
   a first-conductivity type silicon body formed over a buried insulation layer of a silicon-on-insulator semiconductor substrate;
   a gate pattern formed over the silicon body;
   at least one polysilicon spacer formed over one or more sidewalls of the silicon body and containing a second-conductivity type dopant; and
   a contact plug electrically connected with the at least one polysilicon spacer,
   wherein the at least one polysilicon spacer extends from the buried insulation layer to one sidewall of the gate pattern.

10. The semiconductor device in accordance with claim 9, wherein a pair of the polysilicon spacers are formed over opposite sidewalls of the silicon body.

11. The semiconductor device in accordance with claim 10, further comprising two source/drain diffusion regions formed in part of opposite sidewalls of the silicon body adjacent to or adjoining the pair of the polysilicon spacers, wherein the source/drain diffusion regions contain the second-conductivity type dopant diffused from the polysilicon spacers,
   wherein part of the silicon body between the two source/drain diffusion regions acts as a floating body in a floating state when the semiconductor device is operating.

12. The semiconductor device in accordance with claim 9, wherein the contact plug is made of metal.

13. The semiconductor device in accordance with claim 12, wherein the contact plug is adjacent to or adjoins the buried insulation layer.

14. A method for fabricating a semiconductor device, comprising:
   forming a plurality of gate patterns over a first-conductivity type silicon layer of a silicon-on-insulator semiconductor substrate including a buried insulation layer, so that the gate patterns are separated from each other;
   forming a plurality of silicon bodies, each under a corresponding one of the gate patterns, by removing a portion of the first-conductivity type silicon layer exposed between the gate patterns;
   forming a plurality of polysilicon spacers each over a sidewall of the silicon bodies, the polysilicon spacers containing a second-conductivity type dopant; and
   forming a contact plug electrically connected to at least one of the polysilicon spacers,
   wherein the polysilicon spacers extend from the buried insulation layer to a sidewall of the gate pattern.

15. The method in accordance with claim 14, wherein forming the plurality of silicon bodies comprises isolating the silicon bodies from each other by removing the portion of the first-conductivity type silicon layer until a surface of the buried insulation layer is exposed.

16. The method in accordance with claim 14, wherein forming the plurality of polysilicon spacers comprises:
   forming a polysilicon layer containing the second-conductivity type dopant over the semiconductor substrate; and
   removing a portion of the polysilicon layer, so that each of the polysilicon spacer is formed selectively over a sidewall of the gate patterns and a sidewall of the silicon bodies.

17. The method in accordance with claim 14, wherein forming the plurality of polysilicon spacers comprises:
   forming a polysilicon layer over the semiconductor substrate;
   implanting second-conductivity type dopant ions into the polysilicon layer; and removing a portion of the polysilicon layer, so that each of the polysilicon spacer is formed selectively over a sidewall of the gate patterns and a sidewall of the silicon bodies.

18. The method in accordance with claim 14, further comprising diffusing the second-conductivity type dopant from the polysilicon spacers, so that source/drain diffusion regions are formed in part of opposite sidewalls of the silicon bodies adjacent to or adjoining the polysilicon spacers.

* * * * *